United States Patent [19]

Van Yperen

[11] Patent Number: 5,347,218

[45] Date of Patent: Sep. 13, 1994

[54] METHOD AND APPARATUS FOR RAPID SPIN ECHO MAGNETIC RESONANCE IMAGING

[75] Inventor: Gerrit H. Van Yperen, Eindhoven, Netherlands

[73] Assignee: U.S. Philips Corporation, New York, N.Y.

[21] Appl. No.: 52,302

[22] Filed: Apr. 23, 1993

[30] Foreign Application Priority Data

Apr. 24, 1992 [EP] European Pat. Off. ........ 92201156.4

[51] Int. Cl.$^5$ .......................................... G01R 33/20
[52] U.S. Cl. ................................................ 324/309
[58] Field of Search .............. 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,587,489 | 5/1986 | Wehrli | 324/309 |
| 4,621,235 | 11/1986 | Van Uijen et al. | 324/307 |
| 4,672,319 | 6/1987 | Nishimura | 324/309 |
| 4,965,520 | 10/1990 | Sakamoto | 324/309 |
| 4,973,906 | 11/1990 | Bernstein | 324/309 |
| 5,068,609 | 11/1991 | Bruder et al. | 324/309 |
| 5,241,271 | 8/1993 | Taguchi et al. | 324/309 |

FOREIGN PATENT DOCUMENTS

| | | |
|---|---|---|
| 0128622 | 12/1984 | European Pat. Off. . |
| 0175184 | 3/1986 | European Pat. Off. . |
| 0223543 | 5/1987 | European Pat. Off. . |

OTHER PUBLICATIONS

"Spoiling of Transverse Magnetization in Steady-State Sequences" U. Zur et al, Magnetic Resonance in Medicine vol. 21 (1991) pp.251–263.

"Fast Scan Magnetic Resonance Principles and Applications", Raven Press, 1991 pp. 26–40, 149–150.

*Primary Examiner*—Michael J. Tokar
*Attorney, Agent, or Firm*—Jack D. Slobod

[57] ABSTRACT

In a spin-echo magnetic resonance sequence a phase encoding gradient magnetic field (39) is applied after the 180° rephasing pulse ($32_1$). After detection of the spin-echo signal (33) the position dependent phases are compensated for by applying a further gradient magnetic field (39'), identical in size but opposite in sign. The phase difference ($\phi_{32,1} - \phi_{31,1}$) between the RF-pulses ($31_1, 32_1$) applied within a sequence is constant over the sequences. With no position dependent effects left at the end of a sequence the next sequence can be started immediately following the earlier one. A repetition time TR substantially shorter than the spin-spin relaxation time $T_2$ is feasible, thereby developing a steady state of the magnetization. A TR of 50 ms or less can be obtained, as well as strong signals for long $T_2$ substances and good $T_2$ contrast. RF spoiling by changing phases of RF-pulses in subsequent sequences can destroy the $T_2$ signal and provide images with pure $T_1$ contrast.

20 Claims, 2 Drawing Sheets

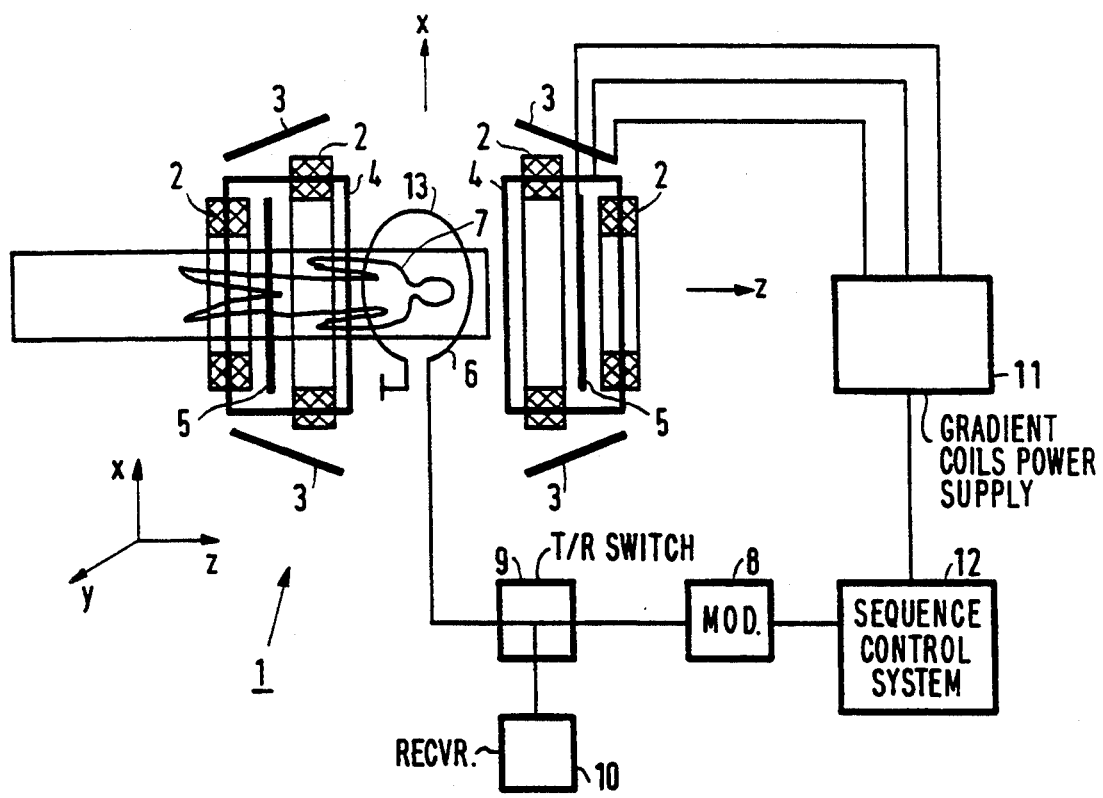
FIG.1
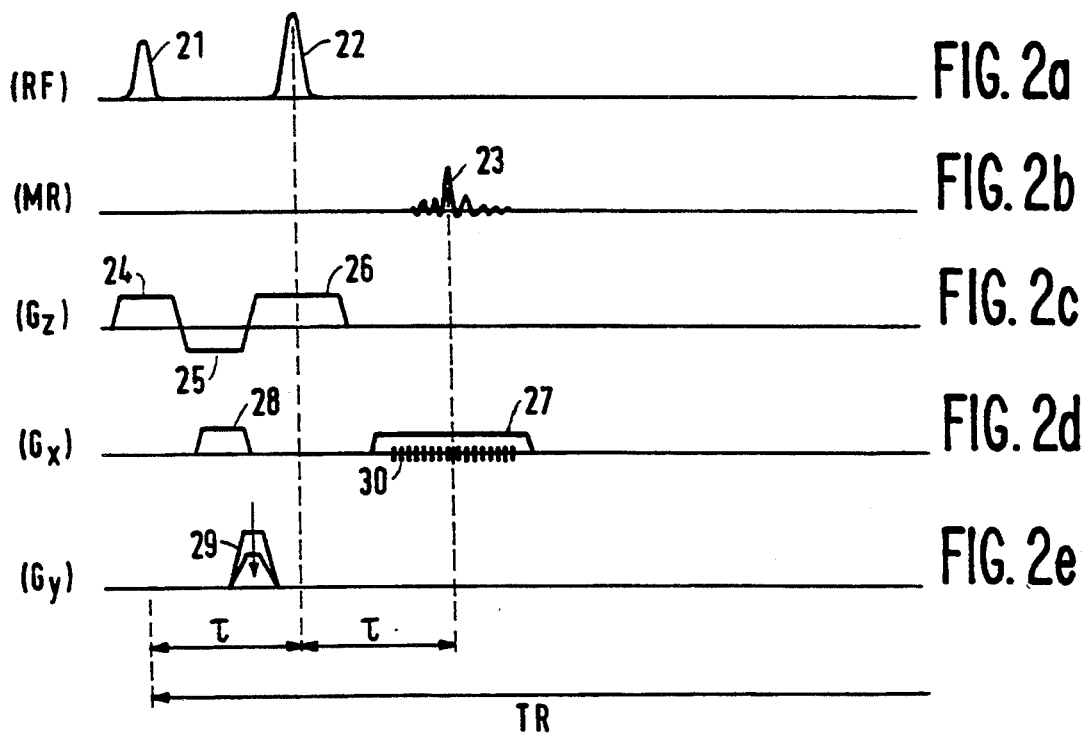

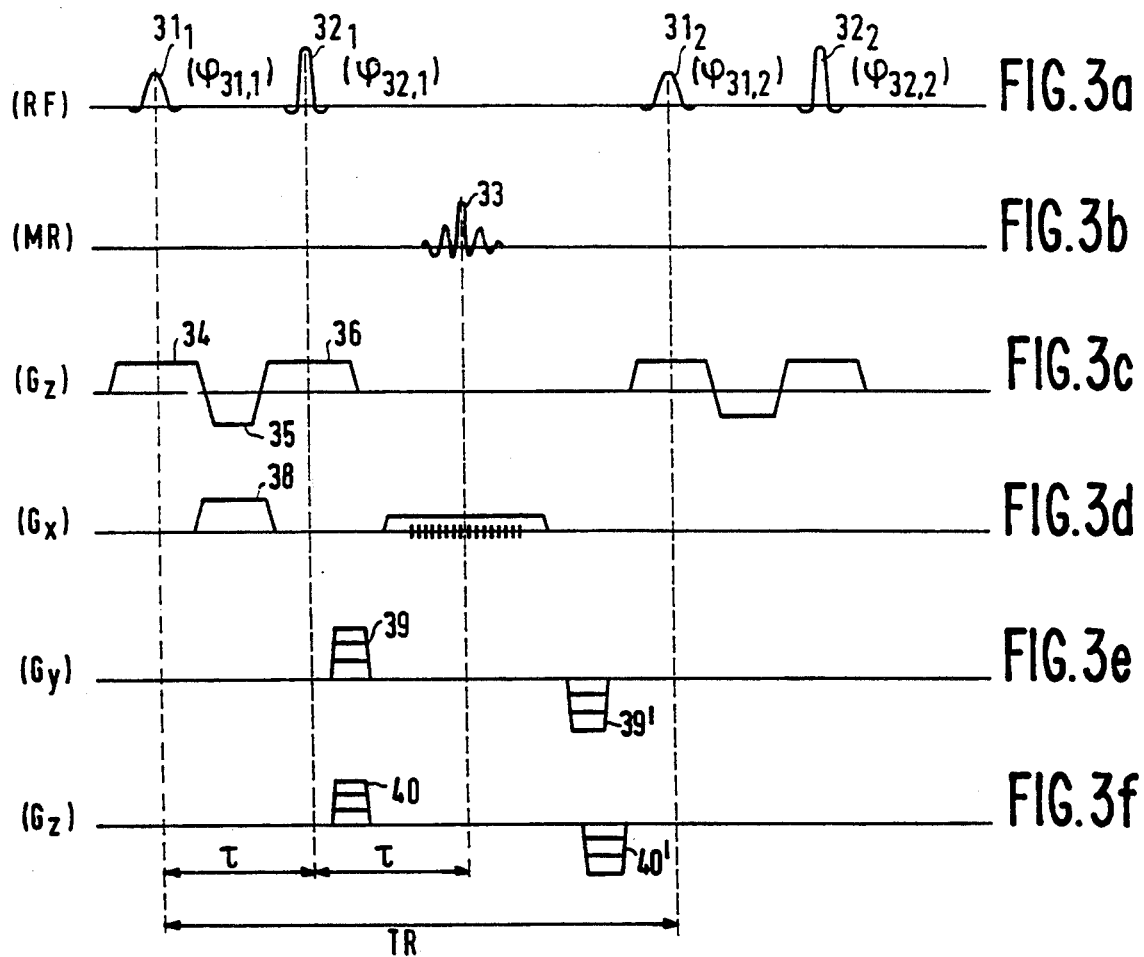
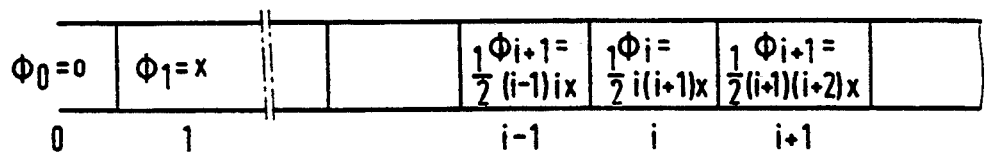
FIG.4

METHOD AND APPARATUS FOR RAPID SPIN ECHO MAGNETIC RESONANCE IMAGING

BACKGROUND OF THE INVENTION

The invention relates to a method for magnetic resonance imaging of a body placed in a stationary and substantially homogeneous main magnetic field, the method comprising repeated execution of a sequence including the following steps:
- application of a first RF-pulse for excitation of at least a portion of the body,
- application of at least a first gradient magnetic field for phase encoding of the excited portion,
- application of a second RF-pulse at a time $\tau$ after the first RF-pulse,
- detection of a magnetic resonance spin-echo signal around a time $2\tau$ after the first RF-pulse,
- whereby a repetition time between first RF-pulses in subsequent sequences is shorter than a transversal relaxation time $T_2$ of a relevant substance of the body. With such a method, images of a slice of a human or animal body or of an object can be obtained with a spin-echo technique. By relevant substance of the body is meant a substance relevant for imaging. For diagnostic purposes, this is a substance such as a body fluid, tissue or fat. In accordance with the convention in the art, $T_2$ is used to designate the transverse spin-spin relaxation time constant.

Such a method is known from EP-B 0 128 622. In that document a method for magnetic resonance imaging is disclosed in which an excitation radio-frequency pulse (90° RF-pulse) is followed by a 180° rephasing RF-pulse after a time interval $\tau$. The 180° RF-pulse rephases the transversal component of the magnetization and generates thereby a spin echo signal that is detected, providing information about the object or body. In order to encode position information in the detected signal, at least a phase encoding gradient is applied before the 180° rephasing RF-pulse providing the signal with position dependent phases. These position dependent phases have to vanish before a next sequence can be started. In order to avoid waiting until the magnetisation of the excited portion has substantially returned to its equilibrium state, a second 180° RF-pulse is applied after detection of the spin-echo signal causing a second spin-echo signal. A second 90° RF-pulse is generated simultaneously with the occurrence of this second spin-echo signal. The second 90° RF-pulse re-orientates the transverse component of the magnetisation into the direction of the main magnetic field. Consequently, it is not necessary to wait until this situation has resulted from natural relaxation of the magnetisation.

Although providing a considerable increase in sampling speed over earlier spin-echo sequences, the repetition time of this known method is still at least about 200 ms. About 100 ms of this time is needed for residual relaxation after the second 90° RF-pulse is applied, and another 50 ms is needed between the detected spin-echo signal and the second 90° RF-pulse. The 100 ms period in the known sequence is needed for the vanishing of position-dependent effects in the excited portion of the body, such residual position dependent effects otherwise would give rise to ghosts and artefacts in a reconstructed image. The 50 ms from the spin-echo signal to the 90° RF-pulse cannot be reduced significantly as the second 180° RF-pulse cannot be applied before the end of detection sequence of the spin echo signal. Therefore, it does not seem feasible to achieve a significant reduction of the repetition time in the known method by reduction of the intervals in between RF-pulses.

SUMMARY OF THE INVENTION

It is, inter alia, an object of the present invention to provide a spin-echo method for magnetic resonance imaging according to the introductory paragraph with a acquisition time considerably shorter than obtainable with the known method.

To this end, the invention is characterised in that
the first gradient magnetic field is applied after the application of the second RF-pulse, and in that
a second gradient magnetic field for compensation of the phase encoding caused by the first gradient magnetic field is applied in the interval after occurrence of the magnetic resonance spin-echo signal and before application of the first RF-pulse in a next sequence. Phase encoding of the excited portion of the body is introduced after the application of the 180° re-phasing RF-pulse. The position dependent effects thereof are removed by the second gradient magnetic field after detection of the spin-echo signal and before the next sequence starts. Consequently, there is no phase difference left between spins in the direction of the phase encoding gradient magnetic field. Position dependent effects due to phase encoding of magnetisation in the excited portion of the body are therefore not present at the start of the next sequence, and a next excitation RF-pulse can be applied without having to realign the magnetisation along the direction of the main magnetic field. The repetition of excitation pulses prior to the vanishing of the transversal excitation allows a fast data acquisition. In medical diagnostic imaging this is most useful in breathhold abdominal imaging, where the total scan time is limited to an interval measured in seconds.

An advantage of a repetition time TR considerably shorter than the transversal relaxation time $T_2$ is that the steady state build-up after a number of repetitions provides a strong coherent signal from excited regions with large $T_2$. Contrast can be manipulated by a proper choice of the interval $\tau$ between the first and second RF-pulses.

It is remarked that a spin-echo magnetic resonance method in which a phase encoding gradient magnetic field is applied after a 180° rephasing RF-pulse and a compensating gradient magnetic field is applied after the spin-echo signal is known per se from EP-A 0 175 184. In that document a multiple spin echo method is disclosed in which a single excitation RF-pulse is followed by a plurality of 180° RF-pulses. Each of the 180° RF-pulses rephases the transversal component of the magnetisation and generates a spin echo signal to be detected.

The known method has as a disadvantage that each of the 180° RF-pulses in a sequence following a 90° excitation RF-pulse occur at different times after the excitation pulse, whereby the generated echo signal is decreasing due to $T_2$ relaxation and pulse imperfections. Moreover, $T_2$-relaxation proceeds from one spin-echo to the next, having as a consequence that the $T_2$-decay evolves differently for different substances in the imaged portion of the body. This results in a blurred image after Fourier transformation. As disclosed in EP-A 0

175 184, special measures are needed to compensate for these effects. These measures increase the total scan time.

It is further remarked that it is known per se, for example from EP-A 0 223 543, in so-called FLASH (Fast Low Angle SHot) or FFE (Fast Field Echo) sequences to use a steady state free precession method for magnetic resonance imaging, whereby the generated magnetic resonance signals are sandwiched between phase encoding gradients of opposite sign. However, FLASH or FFE methods are gradient echo techniques in which echo signals are generated by manipulation of gradient magnetic fields. These techniques inherently suffer from inhomogeneities in the main magnetic field.

For further position determination in two or three dimensions the sequence according to the invention may be provided with additional phase encoding gradient magnetic fields, preferably with a gradient direction perpendicular to the direction of the gradient of the first gradient magnetic field. For three dimensional imaging an additional gradient magnetic field can be applied with a gradient perpendicular to both of the two other ones. Also the phase encoding effects of these gradient fields have to be compensated for prior to application of the next excitation RF-pulse.

A practical embodiment of the method according to the invention is characterised in that
- a selection gradient magnetic field is applied during application of the first RF-pulse for selection of a slice of the body, and in that
- a third gradient magnetic field is applied during detection of the magnetic resonance spin-echo signal for frequency encoding. As known in the art, the excitation pulse in this procedure excites a slice in the body in which the Larmor frequency of the spins corresponds to the frequencies in the RF-pulse, in general the selected slice is perpendicular to the main magnetic field. Within this slice, position information in one direction is encoded by the first gradient magnetic field providing phase encoding, and in the perpendicular direction by a position dependent precession frequency caused by the third gradient magnetic field.

The method according to the invention is further characterised in that phase differences between the first RF-pulse and the second RF-pulses within a sequence are equal over the sequences. By this measure it is assured that the magnetisation in the selected slice will not be disturbed locally by phase changing effects from the RF-pulses in the sequence, and a steady state can be formed, i.e. a state in which the magnetisation and the signals at the end of each sequence are identical. A phase changing effect due to the RF-pulses might lead to signal inhomogeneities and, consequently, to artefacts and ghosts in the resulting image.

This embodiment of the invention may be further characterised in that the first RF-pulses in subsequent sequences have zero phase difference and in that the second RF-pulses in subsequent sequences have zero phase difference. In this embodiment there are no phase changing pattern in the RF-pulses in the repeated sequences. Consequently, any "false" signal contributions, in particular stimulated echo's, will add with the same phase to the desired spin echo signals, so that a steady state signal can build up.

An embodiment of the invention is characterised in that the phases of the first and second RF-pulses in subsequent sequences are mutually different, thereby forming an RF-spoiling scheme. The use of RF-spoiling has as an effect that, despite the steady state magnetisation, no coherent signal is built-up in the course of many repeated sequences. This enables the generation of pure $T_1$-weighted images. A way to establish RF-spoiling is to change the phases of the RF-pulses in the subsequent sequences according to a non-repetitive scheme. It is remarked that RF-spoiling is known per se in FLASH or FFE techniques, for example from the article "Spoiling of transverse magnetization in steady-state sequences" by Y. Zur et al., published in the magazine "Magnetic Resonance in Medicine", Vol. 21 (1991), pages 251-263. As stated before, such techniques suffer from inhomogeneities in the main magnetic field.

An embodiment of this method is further characterised in that the phases of the first and second RF-pulses in successive sequences differ with a linear increasing or decreasing value proportional to the rank number of the sequence. If the phases of the RF-pulses are changed with a linearly increasing or decreasing difference, a sufficient degree of non-repetitiveness is achieved. Of course, care must be taken that the cyclical behaviour of the phase difference does not add up to a set of phases that repeats itself after a few cycles.

An embodiment of the method in accordance with the invention is characterised in that the repetition time TR is about 50 milliseconds or less, preferably about 30 milliseconds. Experiments have shown that with a repetition time TR of 50 milliseconds or less relatively artefact free spin-echo images can be obtained. A repetition time of 30 milliseconds allows a 256×256 matrix to be acquired in less than 8 seconds of scanning time. A value that fits perfectly well in the about 10 seconds maximum that are available for a single breathhold image.

The invention also relates to an apparatus for magnetic resonance imaging according to the preceding method. Such an apparatus comprises means for establishing a stationary and substantially homogeneous main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for
- applying a first radio-frequency pulse (RF-pulse) for excitation of at least a portion of the body,
- applying a at least a first gradient magnetic field for phase encoding of the excited portion,
- applying a second RF-pulse at a time $\tau$ after the first RF-pulse,
- detecting a magnetic resonance spin-echo signal around a time $2\tau$ after the first RF-pulse,
- within a period that allows the repetition time TR between first RF-pulses in subsequent sequences to be shorter than a transversal relaxation time $T_2$ of a relevant substance of the body. The apparatus according to the invention is characterised in that the control means are further arranged for
- applying said first gradient magnetic field after the application of the second RF-pulse, and for
- applying a second gradient magnetic field in the interval after occurrence of the magnetic resonance spin-echo signal and before application of the first RF-pulse in a next sequence, the second gradient magnetic field compensating the phase encoding caused by the first gradient magnetic field.

These, and other more detailed aspects of the invention will now be elucidated by way of example with reference to the accompanying drawings.

BRIEF DESCRIPTION OF THE DRAWING

FIG. 1 is a schematic diagram of a magnetic resonance imaging apparatus;

FIGS. 2a–2e are aligned timing diagrams of transmitted RF signal, received magnetic resonance signal, and Z, X and Y gradients, respectively, in a conventional RF-pulse magnetic gradient sequence for spin echo imaging;

FIGS. 3a–3e are aligned timing diagrams of the same quantities as in FIGS. 2a–2e for a portion of the series of sequences for spin echo imaging in accordance to the invention;

FIG. $3c^1$ is a diagram of Z gradient versus time in accordance with an alternate embodiment of the series of sequences in accordance with the invention; and FIG. 4 is an illustration of an RF-spoiling scheme to prevent the build-up of a steady state.

DETAILED DESCRIPTION OF THE PREFERRED EMBODIMENTS

In FIG. 1 is shown, diagrammatically, a magnetic resonance apparatus 1. The apparatus comprises a set of main magnetic coils 2 for generating a stationary homogeneous main magnetic field and several sets of gradient coils 3, 4 and 5 for superimposing additional magnetic fields with controllable strength and having a gradient in a selected direction. The gradient coils are activated via a power supply 11. The apparatus further comprises means 6 in the form of an RF coil for emitting or transmitting radio-frequency pulses (RF-pulses) to an object or body 7, the emitter means being coupled to a modulator 8 for generating and modulating the RF pulses. Also provided are means for receiving the magnetic resonance signals, these means can be identical to the emitting means 6 or be separate. If the emitting and receiving means are identical, as shown in FIG. 1, a transmit-receive switch 9 is arranged to separate the received signals from the pulses to be transmitted. The received magnetic resonance signals are input to a receiver which demodulates the received signals. The emitting means 6 modulator 8 and the supply 11 for the gradient coils 3, 4 and 5 are controlled by a sequence control system 12 to generate a predetermined sequence of RF-pulses and gradient fields.

If the magnetic resonance apparatus 1 is put into operation with an object or body 7 placed in the magnetic field a small excess of nuclear dipole moments (nuclear spins) will be aligned in the direction of the magnetic field. In equilibrium, this causes a net magnetisation $M_0$ in the material of the body 7, directed in parallel with the magnetic field. In the apparatus 1, the macroscopic magnetisation $M_0$ is manipulated by radiating to the object RF-pulses of a frequency equal to the Larmor frequency of the nuclei, thereby bringing the nuclear dipole moments in an excited state and re-orienting $M_0$. By applying the proper RF-pulses, a rotation of the macroscopic magnetisation is obtained. The application of gradient magnetic fields that create local variations in the magnetic field will further influence the behaviour of the magnetisation. After the application of RF-pulses the disturbed magnetisation will strive to return to a state of thermal equilibrium in the magnetic field, emitting radiation in the process. A well chosen sequence of RF-pulses and gradient fields causes this radiation to be emitted as magnetic resonance signals which provide information about the density of a certain type of nuclei, for example hydrogen nuclei, and the substance in which they occur. By analysis of the emitted signals and presentation of it in the form of images, information about the object or body 7 is accessible. For more detailed descriptions of magnetic resonance imaging (MRI) and of MRI-devices reference is made to the extensive literature on this subject, for example to the book "Practical NMR Imaging", edited by M. A. Foster and J. M. S. Hutchinson, 1987, IRL Press.

FIGS. 2a–2c show a known sequence for generating magnetic resonance signals according to the spin echo technique. These aligned figures show the time relation between RF-pulses and the various pulses of the gradient magnetic fields, the horizontal axis being the time axis. No information about the length of time intervals can be inferred from the time axis. FIG. 2a shows the RF-pulses necessary for the generation of a spin echo signal. A first RF-pulse 21 is applied to rotate the magnetisation $M_0$ over a flip-angle $\alpha$ of approximately 90°. The magnetisation is left to relax for an interval $\tau$ after which a second RF-pulse 22 rotates the now somewhat relaxed magnetisation over a flip-angle $\beta$ having a value of around 180°. The combination of the two RF-pulses 21 and 22 generates a spin echo signal 23, shown in FIG. 2b, centred around a time $2\tau$ after the occurrence of RF-pulse 21. For different kinds of images the first RF-pulse 21 may be chosen to have an angle $\alpha$ considerably different from 90°. For example, an angle of around 150° will reduce $T_1$ contrast in a reconstructed image considerably, emphasising $T_2$ contrast.

As shown in FIG. 2c, the application of RF-pulses 21 and 22 is made coincident with the application of pulses 24, 25 and 26 of the slice selection gradient magnetic field $G_z$, the respective periods 24, 25 and 26 indicate positive and negative gradients. The positive gradient pulses 24 and 26 provide selection of a slice of the object for excitation of the spins, the negative gradient pulse 25 corrects the phase difference of spins in the selected slice due to the variation in magnetic field strength across the width of the slice. In lines d and e the application of a pulse 27 of a frequency encoding or read gradient magnetic field $G_x$ and of a pulse 29 of a phase encoding gradient magnetic $G_y$ are shown, respectively. The gradient directions of the magnetic fields $G_x$ and $G_y$ are perpendicular to each other and to the gradient direction of $G_z$. These gradient magnetic field pulses allow position information encoded in magnetic resonance signals for conversion of these signals in an image via a Fourier transformation. The read gradient pulse 27 is preceded by a dephasing pulse 28 of the frequency encoding gradient magnetic field $G_x$. as indicated by the hatched area's, the dephasing pulse 28 is in the same direction and has the same time-integrated size as the portion of the read gradient pulse 27 prior to the time $2\tau$. The phase encoding pulse 29 is applied before occurrence of the second RF-pulse 22, the read gradient pulse 27 is coincident with the signal 23. As indicated in FIG. 2d by marks 30, during the occurrence of the spin echo signal 23 the signal is sampled many times, a usual number of samples being 256 or 512.

Besides the RF-pulses 21 and 22 to generate the spin echo signal, further RF-pulses can be applied in a sequence. Such RF-pulses are applied for example to achieve spatial saturation or suppression of signals from fat. If the RF-pulses have a phase difference $\phi_{22}-\phi_{21}$ between the phases $\phi_{21}$ and $\phi_{22}$ of the RF-pulses 21 and 22, respectively, which difference varies from sequence to sequence, a certain waiting time is needed after sampling to allow the excited spins to regain thermal equilibrium and the effects of the pulse sequence to vanish before the same slice can be excited and probed again. The repetition time TR between several sequences must be large compared to the relaxation times $T_1$ and $T_2$, which is a period of several seconds or additional pulses to destroy these effects can be applied to reduce the waiting time. In the method according to the present invention the phase difference $\phi_{22}-\phi_{21}$ between the phases $\phi_{21}$ and $\phi_{22}$ of the RF-pulses 21 and 22, respectively, has to be constant over the sequences, whereby contributions due to the pulses will add with the same phase to the detected signals. Also any other RF-pulse in the sequences must have a phase difference with the first RF-pulse that has the same value for all sequences.

In FIGS. 3a–3e, a portion of a series of repeated sequences in accordance with the invention is shown. As in FIGS. 2a–2e, the time relation is broken down in several parallel lines. In FIG. 2a RF-pulses $31_1$ and $32_1$ occur, the RF-pulse $31_1$ rotating the magnetisation over a flip-angle $\alpha$, for example 90° or 150°. In the same Figure RF-pulses $31_2$ and $32_2$ of the next sequence are indicated. The slice selection pulses 34, 35 and 36 of the gradient magnetic field $G_z$ and the frequency encoding or read gradient pulse 37 of the read gradient $G_x$ are applied in the same way and at the same relative positions as in the sequence described in FIG. 2. The read gradient pulse 37 is preceded by a dephasing pulse 38. The phase encoding pulse 39 of the phase encoding gradient magnetic field $G_y$ is located after the RF-pulse $32_1$ but before the moment the first one of the samples 30 of the echo spin signal is taken. After the last of the samples 30 is taken the phase encoding gradient magnetic field is switched on again, indicated by pulse 39'. This second gradient magnetic field pulse is equal in size and opposite in sign to the earlier one 39, thereby removing all phase effects occurring in the selected slice due to the presence of the phase encoding pulse 39.

As already mentioned in relation to FIG. 2a, the phase difference $\phi_{32}-\phi_{31}$ between the phases $\phi_{31,1}$ and $\phi_{32,1}$ of the RF-pulses 31 and 32, respectively, has to be constant over the sequences, i.e. $\phi_{32,1}-\phi_{31,1}$ equals $\phi_{32,2}-\phi_{31,2}$.

When the sequence has been completed no position dependent effects are present any more in the spins of the selected slice. Consequently, a next similar sequence can be applied without the resulting signal being influenced by memory of the past sequence. Sequences may follow each other in a time shorter than the transverse relaxation time $T_2$. Nuclear spins that have long $T_2$, considerable longer than repetition time TR, will build up a steady state signal in the course of repetitions and give a strong coherent signal. Nuclear spins with $T_2$ comparable to the repetition time TR will not build up a steady state and, consequently, regions with short $T_2$ in the body or object will exhibit a high contrast with regions of long $T_2$. Experiments have shown that the repetition time TR of sequences can be as low as 30 milliseconds and highlight long $T_2$ material. The reverse holds for regions with long and short $T_1$ material, regions with long $T_1$ giving a low signal and regions with short $T_1$ providing a large signal. The resulting image exhibits a mixed $T_1$, $T_2$ contrast.

Mixed $T_1$, $T_2$ contrast is not always desirable, additional information can be obtained by detection of regions of short and long $T_1$ material, only. As the steady state signal that allows $T_2$ contrast counteracts the $T_1$ contrast, it is desirable to be able to destroy the steady state and therewith the $T_2$ contrast in a repetition of sequences. In accordance with the invention this is done by changing the phases of the RF-pulses between sequences in a non-repetitive way. The pulses within each sequence having a phase difference that is constant over repetition of the sequences. Illustrated in FIG. 4 is a possible method form obtaining a decrease or increase of the relative phase of successive sequences relative to some reference phase. In FIG. 4 the reference phase is chosen to be zero in the sequence labelled 0. To avoid repetition, the phase difference itself must be changing as well and in a way that will be non-repetitive despite the cyclical nature of phase.

In the example illustrated in FIG. 4, this is achieved in that a certain RF-pulse, for example the first, excitation, RF-pulse $31_{i+1}$, in the $(i+1)^{th}$ sequence has a phase difference with the corresponding RF-pulse $31_i$ in the $i^{th}$ sequence that is equal to $i \cdot x$ in which x is any not simple rational fraction times 360°. Consequently, the absolute phase of the $i^{th}$ sequence for this RF-pulse has a difference of $\frac{1}{2} i \cdot (i+1) \cdot x$ with the corresponding RF-pulse in the $0^{th}$ sequence. As the other RF-pulses in a sequence have a phase difference with the RF-pulse that is constant over the sequences, the same difference between sequences apply for those other RF-pulses. Experiments have shown that this procedure is able to destroy the magnetic resonance signal from long $T_2$ material completely.

FIG. 3c' shows a second phase encoding gradient $G_z$ in the direction of the main magnetic field. Using such a second phase encoding gradient instead of the slice selection gradients shown in FIG. 3c allows a volume to be acquired rather than a slice, thereby generating three dimensional images of the body. Gradient pulse 40 and compensation gradient pulse 40' of the second phase encoding gradient field $G_z$ coincide with gradient pulses 39 and 39', respectively, in gradient field $G_y$. The sizes of the gradient pulses 40 and 40' vary like the sizes of the pulses 39 and 39'. During successive sequences all combinations of sizes of pulses 39 and 40 are to be applied to obtain information from the whole volume of the body.

I claim:

1. Method for magnetic resonance imaging of a body placed in a stationary and substantially homogeneous main magnetic field, the method comprising repeated execution, with a repetition time TR, of a sequence including the following steps:
   application of a first RF-pulse for excitation of at least a portion of the body,
   application of at least a first gradient magnetic field for phase encoding of the excited portion,
   application of a second RF-pulse at a time $\tau$ after the first RF-pulse,
   detection of a magnetic resonance spin-echo signal around a time $2\tau$ after the first RF-pulse, wherein:
   the repetition time TR between the first RF-pulses in subsequent sequences is shorter than a transverse relaxation time $T_2$ of a relevant substance of the body, said first gradient magnetic field is applied after the application of the second RF-pulse, and a second gradient magnetic field for compensation of the phase encoding caused by the first gradient magnetic field is applied in the interval after occurrence of the magnetic resonance spin-echo signal and before application of the first RF-pulse in a next sequence.

2. Method as claimed in claim 1, characterised in that a selection gradient magnetic field is applied during application of the first RF-pulse for selection of a slice of the body, and in that a third gradient magnetic field is applied during detection of the magnetic resonance spin-echo signal for frequency encoding.

3. Method as claimed in claim 1 characterised in that phase differences between the first RF-pulse and the second RF-pulses within a sequence are equal over the sequences.

4. Method as claimed in claim 3, characterised in that the first RF-pulses in subsequent sequences have zero phase difference and in that the second RF-pulses in subsequent sequences have zero phase difference.

5. Method as claimed in claim 3, characterised in that the phases of the first and second RF-pulses in subsequent sequences are mutually different, thereby forming an RF-spoiling scheme.

6. Method as claimed in claim 5, characterised in that the phases of the first and second RF-pulses are changed from one sequence to another according to a non-repetitive scheme.

7. Method as claimed in claim 6, characterised in that the phases of the first and second RF-pulses in successive sequences differ with a linear increasing or decreasing value proportional to a rank number of the sequence.

8. Method as claimed in claim 1, characterised in that the repetition time TR is about 50 milliseconds or less.

9. Apparatus for magnetic resonance imaging comprising means for establishing a stationary and substantially homogeneous main magnetic field, means for generating gradient magnetic field superimposed upon the main magnetic field, means for radiating RF-pulses towards a body placed in the main magnetic field, control means for controlling the generation of the gradient magnetic fields and the RF-pulses, and means for receiving and sampling magnetic resonance signals generated by sequences of RF-pulses and switched gradient magnetic fields, said control means being meant for:

applying a first radio-frequency pulse for excitation of at least a portion of the body, applying at least a first gradient magnetic field for phase encoding of the excited portion, applying a second RF-pulse at a time $\tau$ after the first RF-pulse, and detecting a magnetic resonance spin-echo signal around a time $2\tau$ after the first RF-pulse, in a sequence which is repeatedly executed with a repetition time TR between first RF-pulses in subsequent sequences that is shorter than a transverse relaxation time $T_2$ of a relevant substance of the body, characterised in that the control means are further arranged for applying said first gradient magnetic field after the application of the second RF-pulse, and applying a second gradient magnetic field in the interval after occurrence of the magnetic resonance spin-echo signal and before application of the first RF-pulse in a next sequence, the second gradient magnetic field compensating the phase encoding caused by the first gradient magnetic field.

10. Method as claimed in claim 2, characterized in that phase differences between the first RF-pulse and the second RF-pulses within a sequence are equal over the sequences.

11. Method as claimed in claim 10, characterized in that the first RF-pulses in subsequent sequences have zero phase difference and in that the second RF-pulses in subsequent sequences have zero phase difference.

12. Method as claimed in claim 10, characterized in that the phases of the first and second RF-pulses in subsequent sequences are mutually different, thereby forming an RF-spoiling scheme.

13. Method as claimed in claim 12, characterized in that the phases of the first and second RF-pulses are changed from one sequence to another according to a non-repetitive scheme.

14. Method as claimed in claim 13, characterized in that the phases of the first and second RF-pulses in successive sequences differ with a linear increasing or decreasing value proportional to a rank number of the sequence.

15. Method as claimed in claim 2, characterised in that the repetition time TR is about 50 milliseconds or less.

16. Method as claimed in claim 3, characterised in that the repetition time TR is about 50 milliseconds or less.

17. Method as claimed in claim 4, characterised in that the repetition time TR is about 50 milliseconds or less.

18. Method as claimed in claim 11, characterised in that the repetition time TR is about 50 milliseconds or less.

19. Method as claimed in claim 12, characterised in that the repetition time TR is about 50 milliseconds or less.

20. Method as claimed in claim 1 wherein said first RF-pulse has a flip-angle substantially greater than 90° and less than 180° and said second RF-pulse has a flip-angle substantially equal to 180°.

* * * * *